United States Patent [19]

Owens

[11] 3,996,521
[45] Dec. 7, 1976

[54] SIGNAL-SEEKING RADIO RECEIVER WITH BAND TUNING AND SELECTING MEANS

[75] Inventor: Kenneth R. Owens, Indianapolis, Ind.

[73] Assignee: Regency Electronics, Inc., Indianapolis, Ind.

[22] Filed: Nov. 17, 1975

[21] Appl. No.: 632,474

[52] U.S. Cl. ............................ 325/470; 325/471
[51] Int. Cl.² ........................................ H04B 1/34
[58] Field of Search ............ 325/459, 460, 470, 471

[56] References Cited

UNITED STATES PATENTS 3,824,475   7/1974   Pflasterer .......................... 325/470

Primary Examiner—Harold I. Pitts
Attorney, Agent, or Firm—Woodard, Weikart, Emhardt & Naughton

[57] ABSTRACT

A signal-seeking radio receiver is disclosed which can be programmed to receive 20 different channels in any combination of three bands with a minimum of switching circuitry. Additionally disclosed is tuning circuitry for tuning the receiver in response to the programming to either the upper or lower portion of any given band.

18 Claims, 5 Drawing Figures

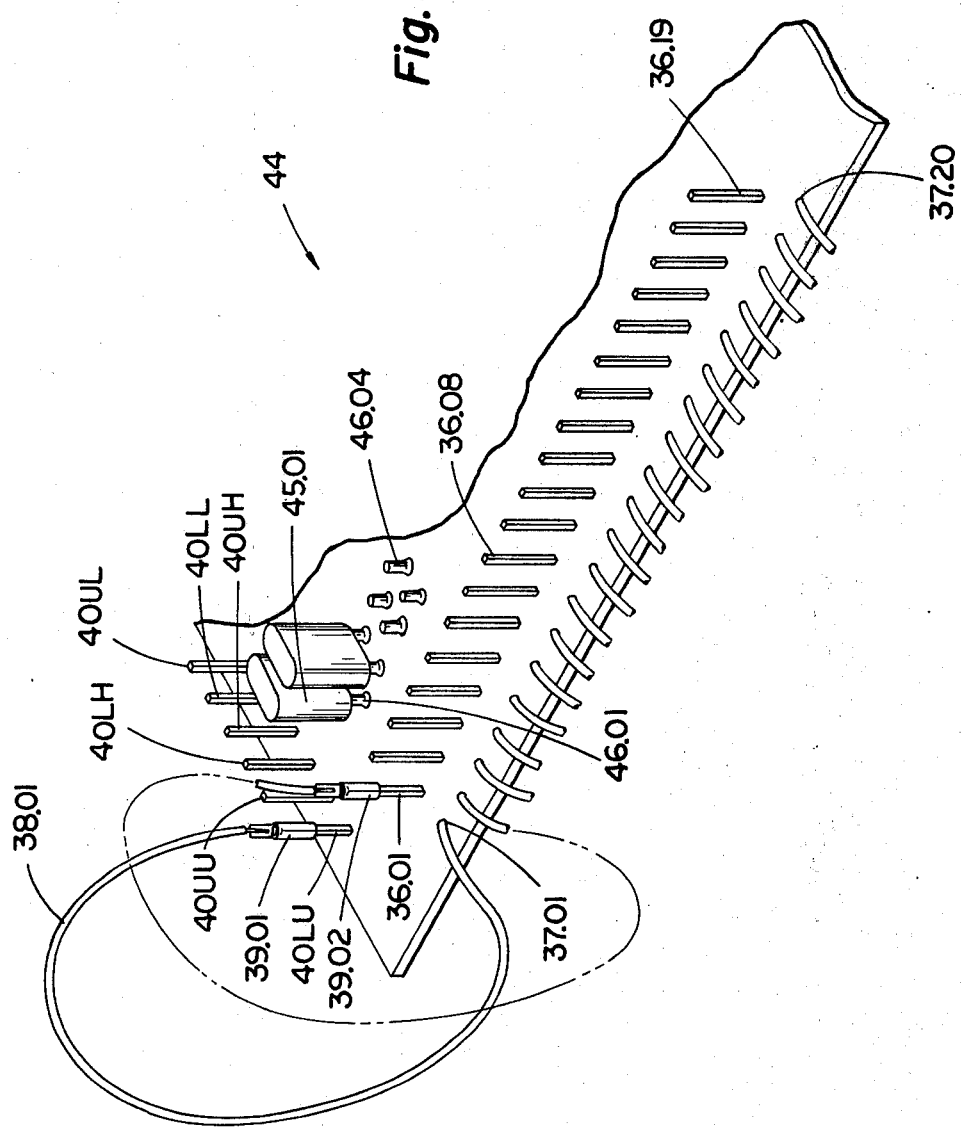

SIGNAL-SEEKING RADIO RECEIVER WITH BAND TUNING AND SELECTING MEANS

BACKGROUND OF THE INVENTION

The invention relates to signal-seeking radio receivers and in particular to stepping radio receivers for production of audio signals from radio frequency signals, which receivers are capable of turning to several separate channels on a plurality of bands. The invention disclosed and claimed herein can be considered to be an improvement on the invention of U.S. Pat. No. 3,665,318 to Hoffman et al. In prior art patents, such as the Hoffman et al. patent, band selection was accomplished through the use of a patch panel in which there was one wire associated with each channel. On the end of the wire was a connecting element which fit over pins associated with each band. For each channel there was one pin associated with each band whereby selection could be readily made by placing the wire and connector corresponding to a channel on the pin corresponding to the band desired for that channel. For two band receiver having only a few channels, this technique functioned without appreciable difficulty. However, when it was desired to have 16 channels and three bands, this technique required 16 wires and connectors at the end thereof together with 48 pins to which the wires could be connected to select bands.

One prior art device of this type substituted for wires and connectors 3 position switches to select the band for each channel. This alternative is disclosed in U.S. Pat. No. 3,824,475 to Peter W. Pflasterer. A device in the television field which selected bands with a 3 position switch is shown in U.S. Pat. No. 3,596,183. Band selection in U.S. Pat. No. 3,873,924 to Fathauer was accomplished by placing the pins associated with a crystal into either one or another crystal pin socket. Here again, while this technique functioned tolerably for two band receivers, difficulty is encountered when it is desired to expand the system to handle three bands.

Another problem encountered in prior art signal-seeking receivers is the tuning of the front end of the receiver. Stepping radio receivers which listen to several separate channels normally require a relatively broad tuned front end in order to accept all of the signals in the band of operation. Difficulty is encountered in designing broad tuned circuits without having adverse effects associated with such designs. To overcome this problem, the certain receivers of the prior art have used variable reactance elements in the tuned circuits in the front end of the receiver. The tuned circuits are then varied to correspond with the desired frequency. In this way a much narrower bandwidth front end circuit can be utilized. However, alignment of the tuning of the front end then becomes a problem and the expense of the additional circuitry adds a substantial cost to the product.

U.S. Pat. No. 3,873,924 to Fathauer discloses a circuit for varying the tuning of the front end of the circuit in response to the local oscillator frequency. U.S. Pat. No. 3,596,183 also shows the use of tuned circuits which are varied in response to a signal corresponding to the oscillator frequency. Neither the use of a broad band front end fixed tuned filter not a narrow band variable tuned filter has been able to produce a quality receiver at a low cost.

SUMMARY OF THE INVENTION

One aspect of the invention relates to an improved multi-band stepping radio receiver which has a programmable band selecting means with several wires having a first type of connecting elements attached to one end and having a first plurality of a second type of connecting elements which are of a design which permits them to mate with the first type of connecting elements, each element of the first plurality being electrically connected to the end of one of the wires and coupled to an output of the steppping means and having a second plurality of the second type of connecting elements each connecting element of the second plurality connecting with circuitry for enabling operation on a particular one of the bands. The invention also relates to a stepping radio receiver which is improved by having a bandpass filter in its RF signal receiving circuit which has a variable center frequency which may be set at a plurality of specific center frequencies and which includes a programmable patchboard bandpass selecting means to select a specific center frequency for each of the channels which it is designed to receive. For a precise definition of the invention, reference should be made to the claims.

In accordance with the present invention three bands are provided, mainly, low and high VHF and a UHF band. The low VHF band may be in the range of 30 to 50 MHz, the high VHF band in the range of 148–174 MHz and the UHF band in the range of 450–512 MHz. Through the use of the present invention, any one of the channels of operation of the receiver may be on any one of the bands. Moreover, with the use of one aspect of the invention, the front end of the receiver can be tuned to either the upper of lower portion of the band and thereby be tuned to a bandwidth which encompasses to the desired frequency within the band. All of this can be accomplished with very little expense and with very simple circuitry. The patchboard technique disclosed herein uses fewer electrical contacts and less board space than any comparably priced technique of the prior art.

It is therefore an object of the invention to provide a multi-band stepping radio receiver which is more economical and more compact than prior art receivers. It is a further object of the invention to provide a stepping radio receiver in which the tuning of the RF signal receiving means can be varied between distinct ranges of bandwidth by varying the reactance of an element in a tuning circuit between distinct levels.

BRIEF DESCRIPTION OF THE DRAWINGS

Other objects and advantages of the present invention will become apparent from the following detailed description particularly when taken in conjunction with the accompanying drawings in which:

FIG. 5 is a pictorial illustration of the patch panel preferably used in the circuit of FIG. 1.

DESCRIPTION OF THE PREFERRED EMBODIMENT

Figure 1:
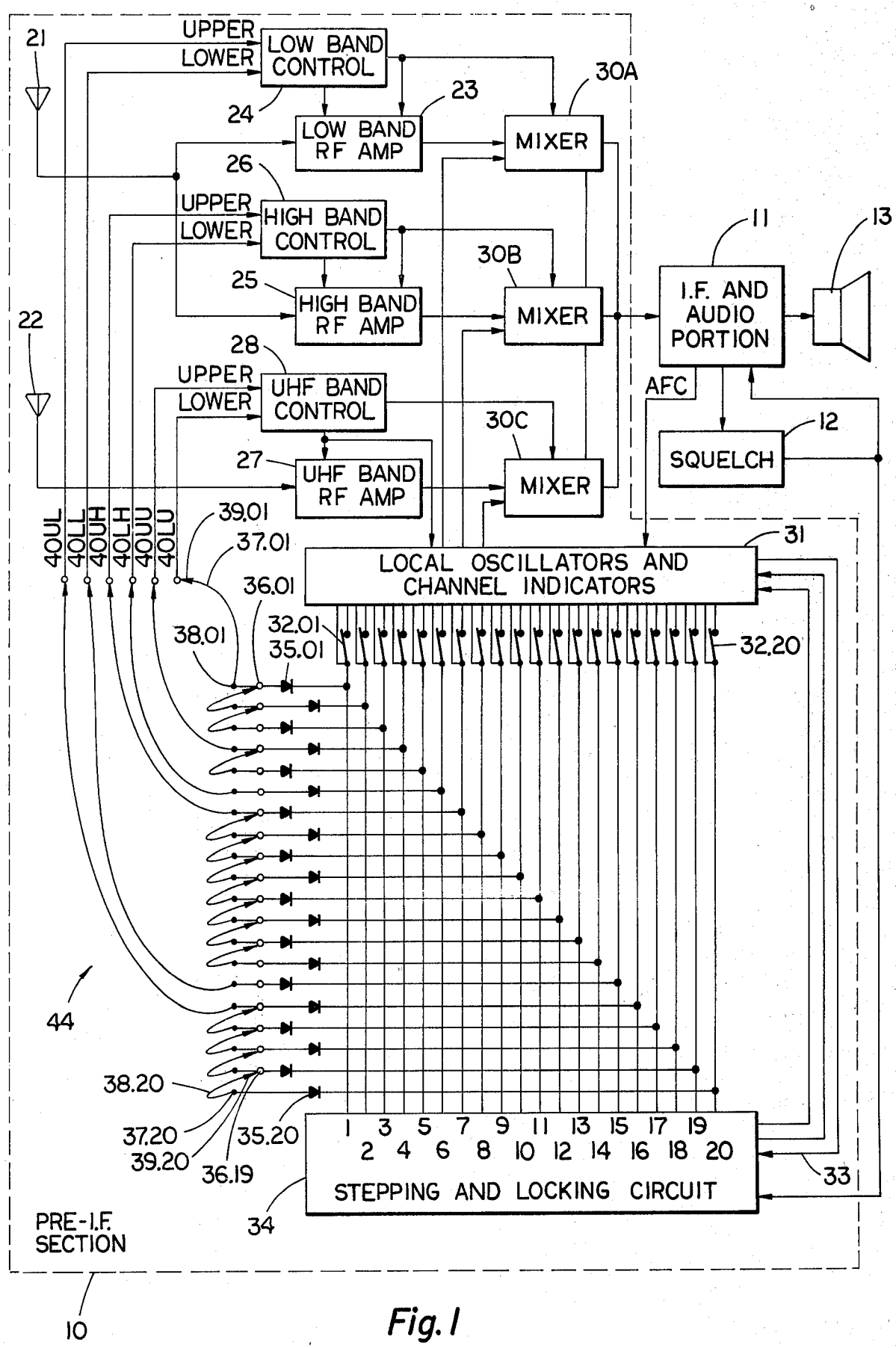
FIG. 1 is a block diagram illustrating the preferred embodiment of a stepping radio receiver of the present invention.
Figure 2:
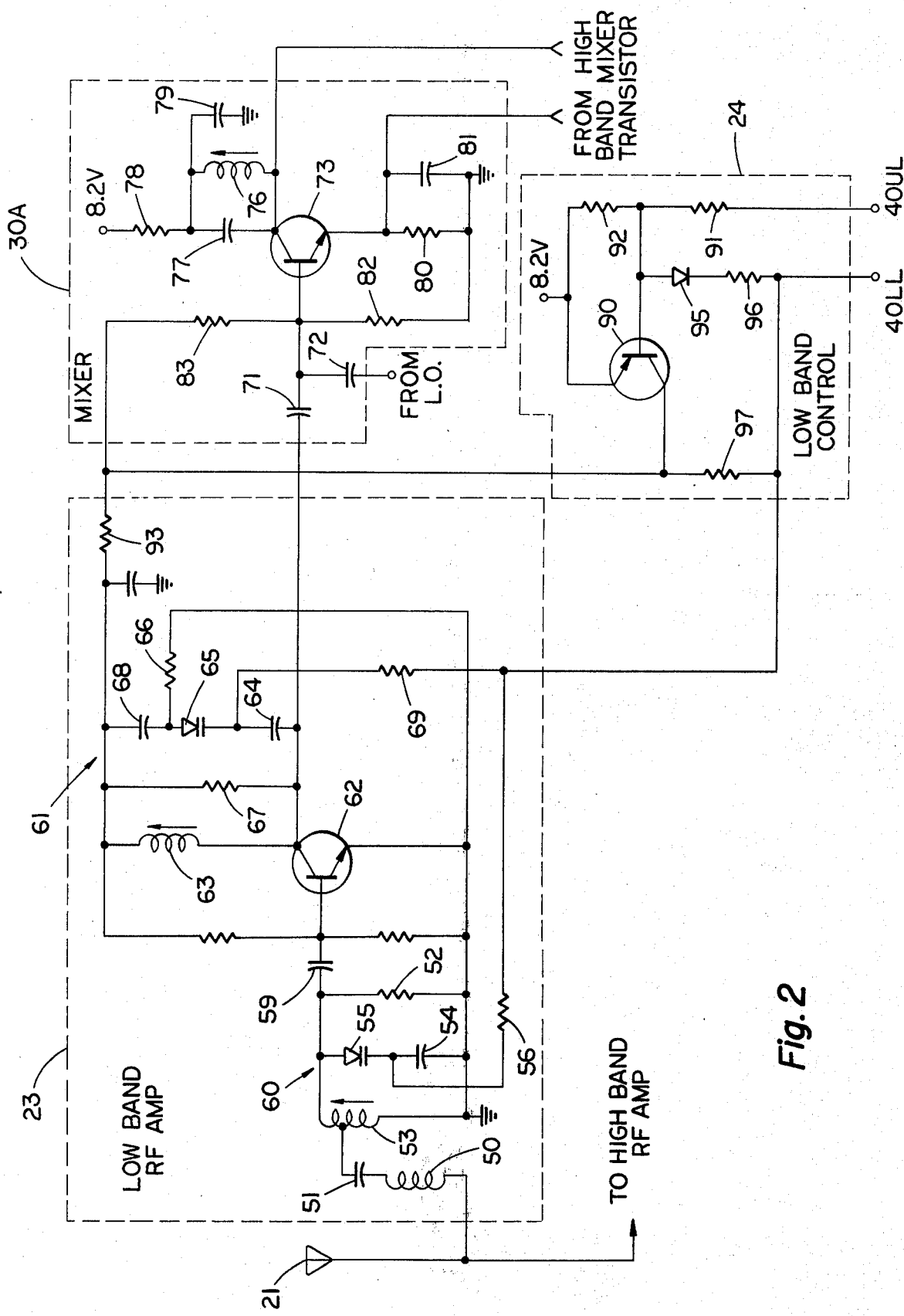
FIG. 2 is a circuit diagram of the low band RF amplifier mixer and control circuit of FIG. 1.

Referring now more particularly to the drawings there is illustrated in FIG. 1 a block diagram of the preferred embodiment of a stepping radio receiver of the present invention. The receiver is designed for production of audio signals from audio modulated radio frequency signals and would normally operate on three bands to receive FM signals thereon. The bands of operation are the low band VHF, high band VHF and UHF band. The receiver includes a pre-IF section 10, and an audio detection means which includes IF and audio portion 11, a squelch circuit 12 and a speaker 13. The squelch circuit 12 is a noise squelch circuit which functions conventionally to prevent production of an audio signal when an RF signal is not being received. The pre-IF section 10 includes an antenna 21 which functions to receive low band and high band VHF signals and an antenna 22 which functions to receive UHF band signals. The antenna 21 connects to low band RF amplifier 23 which is illustrated in FIG. 2 in more detail. The output of low band RF amplifier 23 connects to mixer 30A. Low band amplifier 23 and mixer 30A are controlled by low band control circuit 24. Low band RF amplifier 23 and antenna 21 function as an RF signal receiving means for providing a sufficient RF signal receiving means for providing a sufficient RF signal level at low band frequencies for the mixer circuitry 30A.

Figure 3:
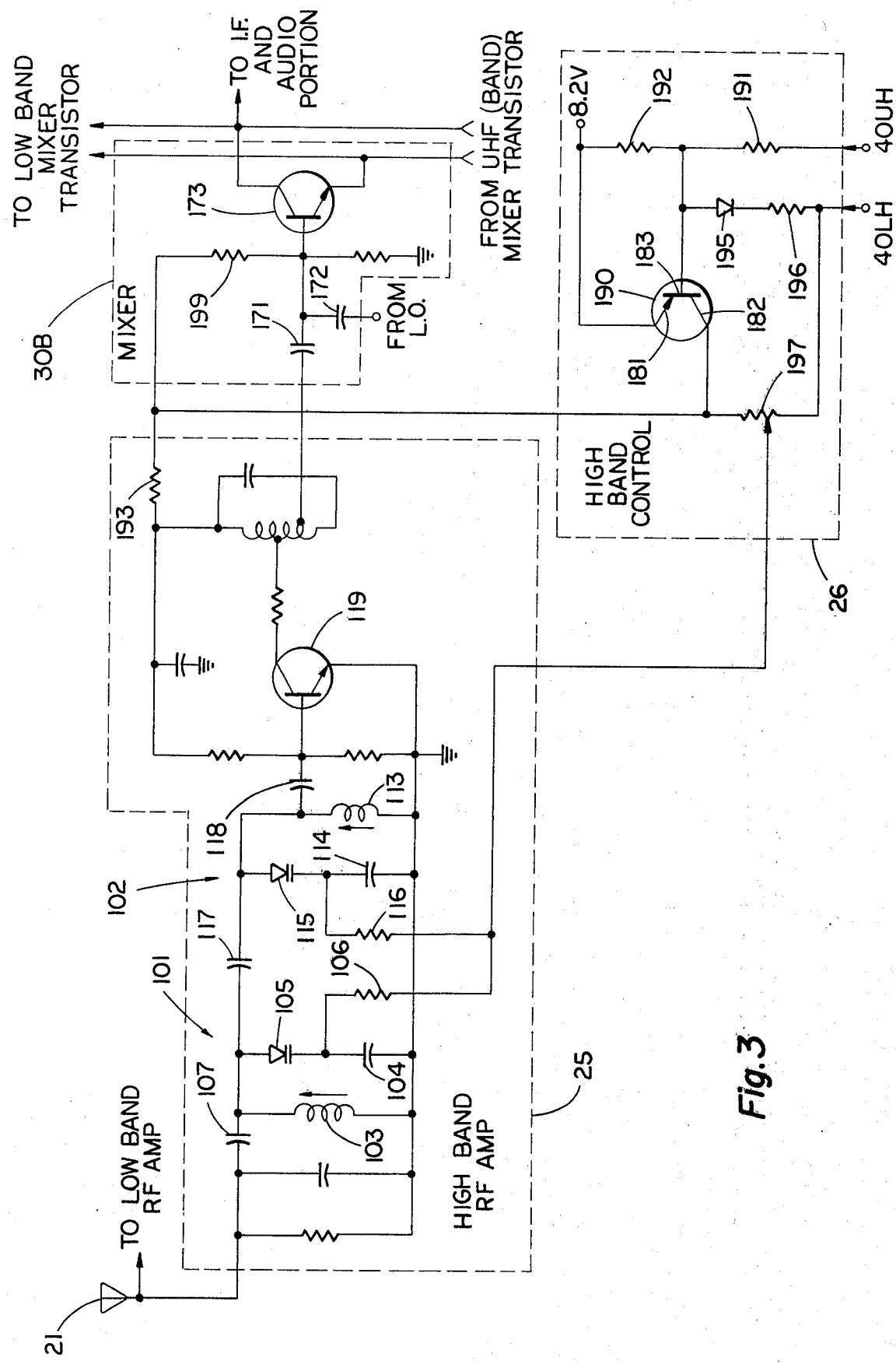
FIG. 3 is a circuit diagram of the high band RF amplifier mixer and control circuitry of FIG. 1.

Similarly for the high band, there is a high band amplifier 25, a high band control circuit 26 and a mixer circuit 30B all of which are shown in more detail in FIG. 3. The high band RF amplifier 25 and control circuit 26 together with antenna 21 function as an RF signal receiving means for providing sufficient RF level at band VHF frequencies for the mixer circuit 30B.

Figure 4:
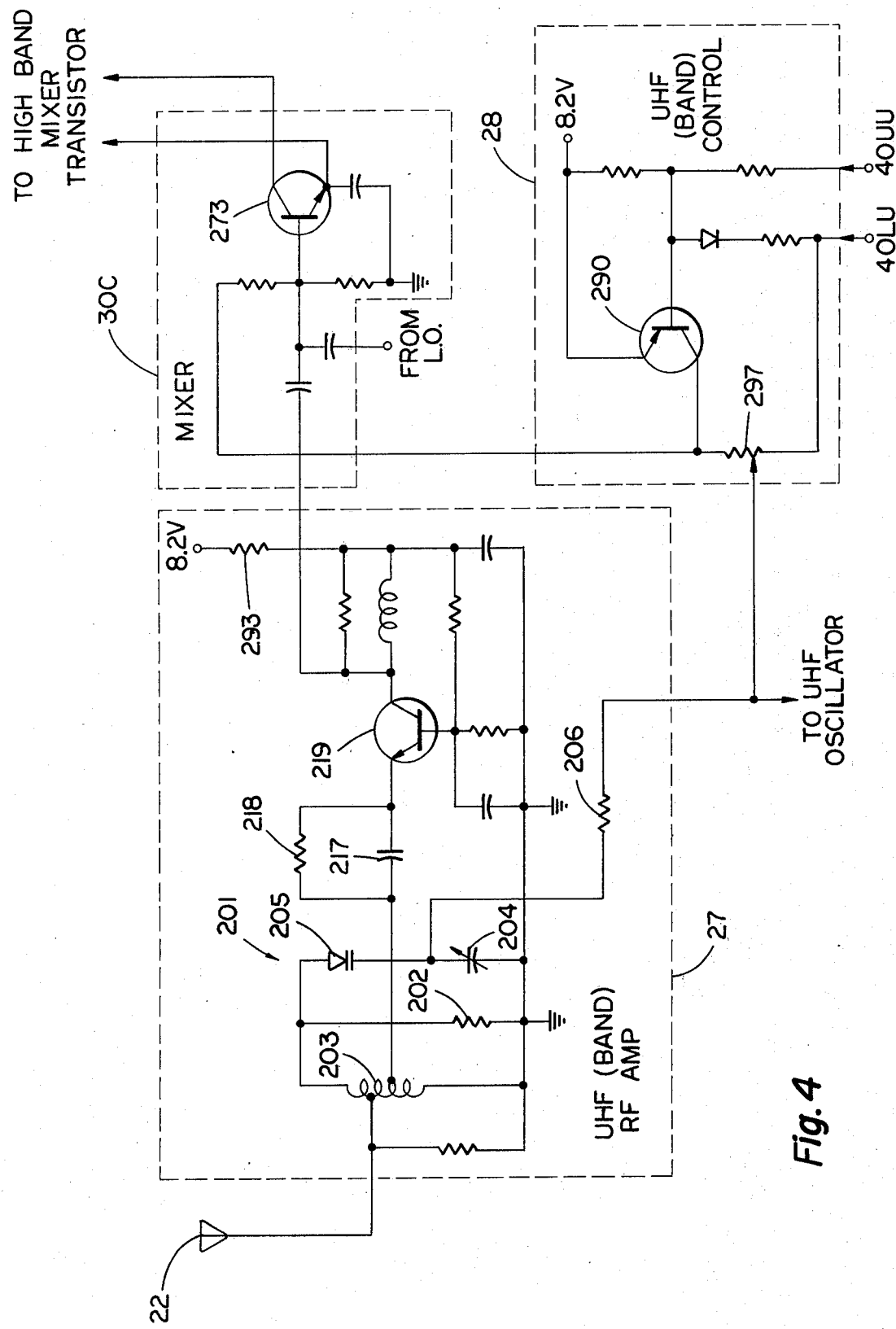
FIG. 4 is a circuit of the UHF band RF amplifier, mixer and control circuitry of FIG. 1.

UHF band amplifier 27 and UHF band control 28 together with antenna 22 as is illustrated in more detail in FIG. 4 function to provide UHF band signals of sufficient strength for the mixer 30C. The injection frequencies for mixer circuits 30A, 30B and 30C are obtained from the local oscillators and channels indicators circuit 31 in a conventional manner such as in shown in U.S. Pat. No. 3,824,475 to Pflasterer.

Individual switches 32.01 to 32.20 control the individual channels. There are illustrated 20 switches for controlling the 20 channels. To improve clarity of this disclosure, item numbers have been omitted from the second through the nineteenth switches, and it may be assumed that they bear the numbers in 0.01 increments from 32.02 to 32.19 consecutively and respectively. Similarly where there are nineteen or twenty elements set forth only integer item number will be given with decimal points being reserved for the number of the element in the grouping of nineteen or twenty.

When any one of the twenty switches 32.01 to 32.20 are open, the channel corresponding to that switch is rendered inoperative and the channel indicator (not shown) is correspondingly rendered inoperative. This can be sensed by circuitry in the local oscillators and channel indicator circuit 31 and caused to change the rate of stepping of the stepping and locking circuit 32 by connection thereto through sense line 33. Local oscillators and channel indicators circuit 31 includes a local oscillator which may be of a conventional design such as is shown in U.S. Pat. No. 3,824,475, but preferably is of a design such as is shown in copending patent application Ser. No. 632,473, filed Nov. 17, 1975 entitled CRYSTAL CONTROLLED STEPPING RADIO RECEIVER HAVING NOVEL OSCILLATOR CIRCUIT. The oscillator provides injection frequencies for the mixers 30A-30C, there being one frequency for each channel to which the receiver can tune. The stepping and locking circuit 34 may be of any conventional design such as the shift register circuitry of U.S. Pat. No. 3,714,585 or the binary counter and decoder circuitry of U.S. Pat. Nos. 3,665,318 or 3,824,475. The operation of the stepping and locking circuit 34 is such that only one of its outputs 1 through 20 is "on" at a given time and the outputs normally sequence in order from 1 through 20 and then being again at 1. This functions to step the oscillator through each of its 20 frequencies. Preferably two decade decoders are used in the twenty channel receiver. Motorola integrated circuit 74145 is appropriate. When an output of the stepping and locking circuit 34 is "on," it approaches ground potential. When an output is "off," it acts essentially as an open circuit. The stepping and locking circuit 34 is defeatable by action of the squelch circuit 12. This action defeats the stepping as long as an RF signal is being received and allows resumption of automatic stepping when no signal is being received.

It can be observed that outputs 1 through 20 of stepping and locking circuit 34 connects not only to switches 32.01 to 32.20 but additionally through diodes 35.01 to 35.20 to pins 36.01 through 36.19 (except output 20) and to ends 37.01 to 37.20 of wires 38.01 to 38.20. It can be noted that output 20 connects only through diode 35.20 to the end 37.20 of wire 38.20 and not to any pin connector as do all of the other outputs. Each of the wires 38.01 to 38.20 have connected on one end a connecting element 39.01 to 39.20 which is of a design which permits it to mate with any one of the pins 36.01 to 36.19.

Additionally present in the pre-IF section are 6 pins, 4OUL, 4OLL, 4OUH, 4OLH, 4OUU and 4OLU. These 6 pins are permanently connected to the band circuits 24, 26 and 28 and are used to carry the signals which determine which bands are operative and which portion of a band is being tuned to. The 6 pins are of identical design to pins 36.01 to 36.19.

Pin 4OUL connects to the low band control circuit. When pin 4OUL is grounded the low band control circuit will cause the low band RF amplifier 23 and mixer 30A to become operative and be tuned to the upper portion of the low band (38–50 MHz). Correspondingly, grounding pin 4OLL will cause the low band RF amplifier 23 and mixer 30A to become operative. However, in this situation the low band RF amplifier will be tuned to the lower portion of the low band (30–38 MHz). In a similar manner the other 4 of the group of 6 pins function to control the respective high band and UHF band circuitry.

Referring in particular to FIG. 2 there is illustrated in detail the circuitry of the low band RF amplifier 23, mixer circuitry 30A, and low band control circuit 24. The signal received on antenna 21 is fed through a series LC circuit comprised of inductor 50 and capacitor 51 which serves to isolate high band frequencies from the remaining portion of the low band amplifier. The low band amplifier includes a parallel resonant bandpass filter circuit 60 which is made rather broad in bandwidth by resistor 52 and which includes a tapped inductor 53 and a capacitor 54 and a varactor diode 55. Inductor 53, capacitors 54, capacitors 54 and 55

(varactor diode 55 functions as a capacitor) and resistor 52 function as a bandpass filter in the RF amplifier 23. The bandpass filter has a variable center frequency which may be set at two different frequencies by the low band control circuitry 24 which connects through resistor 56 to the varactor diode 55. The output from the bandpass filter 60 is coupled through capacitor 61 to a transistor 62 which amplifies RF signals.

A second broad band, bandpass filter 61 is present at the collector of transistor 62 and includes an inductor 63, capacitor 64, a varactor diode 65, a resistor 67 and a capacitor 68. The capacitance of the varactor diode 65 is controlled by a voltage supplied through resistor 69 from the low band control circuit 24. The current through varactor diode 65 finds a path to ground by passing through resistor 66. Amplified radio frequency signals from the low band RF amplifier 23 pass through capacitor 71 and mix with a signal coupling through capacitor 72 from the local oscillator in the local oscillators and channel indicators circuit 31. Both signals are then mixed and amplified by transistor 73 and associated circuitry to produce an IF signal which then connects to the IF and audio portion 11 of the receiver.

The parallel resonant circuit including inductor 76 and capacitor 77 is tuned to the IF frequency. Voltage is applied to the collector of transistor 73 from an 8.2 volt supply through resistor 78 and inductor 76 and is filtered with capacitor 79. The emitter of transistor 73 connects through resistor 80 and capacitor 81 to ground. Base bias resistors 82 and 83 serve to bias transistor 73 in an amplifying mode when transistor 90 is on.

Transistor 90 is controlled by either one of two inputs, one of which connects to pin 4OLL and the other of which connects to pin 4OUL. When pin 4OUL is grounded transistor 90 is turned on because the voltage divider consisting of resistor 91 and 92 is sufficient to cause emitter to base current to flow. The voltage on the base of transistor 90 will be near 8.2 volts and the voltage on the collector of transistor 90 will also be near 8.2 bolts when the transistor is "on." This will supply voltage not only to the low band RF amplifier through resistor 93, but additionally it will bias "on" mixer transistor 73 by its action through resistor 83. The voltage on the base and collector of transistor 90 will cause current to flow through diode 95 and resistors 96 and 97 and also respectively through varactor diodes 55 and 65 to cause them to be strongly back biased and thereby to have a relatively small capacitance. This will correspondingly cause the tuning of the bandpass filters 60 and 61 to be at the upper portion of the low band (38-50 MHz).

If instead of grounding 4OUL, pin 4OLL is grounded, transistor 90 is still turned "on" because of the voltage division caused by resistors 92 and 96. However, no voltage is present across the varactor diodes due to the ground potential on pin 4OLL being coupled through resistors 56 and 69 to the varactor diodes. There being essentially no reverse bias on the varactor diodes, their capacitance will be relatively large and the bandpass filters 60 and 61 will then be tuned to the lower portion of the low band (30-38 MHz).

Referring now in particular to FIG. 3 there is illustrated a high band RF amplifier 25, mixer circuit 30B and a high band control circuit 26. The high band RF amplifier has two broad band bandpass filters 101 and 102. Filter 101 includes inductor 103, capacitor 104 and varactor diode 105. The center frequency of filter 101 is variable by the change of the current through varactor diode 105. Filter 101 may be changed from a bandpass of 148–160 MHz and a center frequency of 154 MHz to a bandpass of 160–174 MHz and a center frequency of 167. Similarly filter 102 includes inductor 113, capacitor 114 and varactor diode 115 which function similarly to the corresponding components of filter 101.

Signals from antenna 21 couple through capacitor 107, through filter 101 and then through capacitor 117, through filter 102 and then through capacitor 118 to an amplifying transistor 119. The output of the amplifying stage which includes transistor 119 passes through capacitor 171 and mixes with a signal from the local oscillator which passes through capacitor 172. The two mixed signals are amplified by transistor 173 and associated circuitry. Transistor 173 shares collector and emitter circuits with transistor 73 of FIG. 2. The base bias on transistor 173 is controlled by high band control circuit 26 to either cause transistor 173 to be turned off or to be operating. The high band control circuit 26 includes transistor 190 which has 3 elements—an emitter 181, a collector 182 and a base 183. The emitter 181 of the transistor 190 connects to a source of supply voltage at 8.2 volts. The base 183 of transistor 190 connects also to the source of supply voltage through resistor 192 and through resistor 191 to pin 40UH. The base 183 of transistor 190 also connects to diode 195 and resistor 196 to pin 40LH. Pin 40LH connects to one side of potentiometer 197 the other side of which connect to collector 182. The wiper of potentiometer 197 connects through resistors 106 and 116 to the respective varactor diodes 105 and 115. The collector 182 of transistor 90 also connects to supply power to the high band RF amplifier 25 through resistor 193 when transistor 90 is turned "on." Referring now to FIG. 4 there is illustrated a UHF band RF amplifier 27, mixer circuit 30C and UHF band control 28. UHF band RF amplifier 27 includes a relatively broad band bandpass filter 201. This filter 201 has a variable center frequency due to the action of varactor 205 in combination with variable capacitor 204, resistor 202 and inductor 203. Signals received by antenna 22 are filtered by bandpass filter 201 and pass through capacitor 217 and resistor 218 to transistor 219 where they are amplified and then fed to mixer 30C. Mixer 30C includes a transistor 273 and associated circuitry which function in a manner similar to that described with respect to transistor 173 in mixer 30B.

It can be noted that the UHF band RF amplifier 27 is continually "on" due to the connection of transistor 219 to a source of supply voltage through resistor 293. The band control circuitry 28 for the UHF circuit differs from the other band control circuits in that it does not switch the power to the RF amplifier. However, it still switches the base bias on mixer transistor 273 in a manner similar to the high band control circuits 24 and 26. Since the operation of the UHF band control circuit 28 and its transistor 290 is as described with respect to high band control circuit 26 it will not be further described. The output of the UHF band control circuit 28 controls the capacitance of varactor diode 205 by its connection thereto by resistor 206. The output of VHF band control circuit 28 also controls a varactor (not shown) in a tuned circuit in the local oscillators and channel indicators circuit 31. Details of this circuit are disclosed in the above mentioned copending patent application. Capacitor 204 may be adjusted to achieve the desired center frequency (496 MHz) for the upper portion of the UHF band (480–512 MHz) and potentiometer 297 may be adjusted to achieve the desired center frequency (465 MHz) for the lower portion of the UHF band (450–480 MHz). Thereafter, programming by connection of connectors such as connectors 39.01 and 39.04 to pins 40LU and 40UU will result in the tuning of the UHF band through the lower portion thereof when the first output of stepping and locking circuit 34 is "on" and the upper portion thereof for when the fourth output of stepping and locking circuit 34 is "on."

Referring now to FIG. 5 there is illustrated the programmable patchboard device 44 shown in circuit form in FIG. 1. This device serves more than one function. It serves as a programmable band selecting means connected to the respective control circuits 24, 26 and 28. Each control circuit funtions to enable operation on one of the bands. The programmable band selecting means connects (as is illustrated in FIG. 1) to the stepping means. The patchboard shown in FIG. 5 also serves as a programmable bandpass selecting means for determining the center frequency of the bandpass filter of the RF amplifier. Therefore, the patchboard of FIG. 5 actually serves not only to select bands, but additionally to control the tuning within a band to a particular range of frequencies.

It can be observed from FIG. 5 that the location of the crystals (such as crystal 45.01) which control the reception frequencies of the receiver is adjacent to pins 36.01 to 36.19 and wire ends 37.01 to 37.20. Therefore, in operation, a particular crystal for a given frequency is placed in a particular socket. Then the connector on the end of the wire corresponding to the channel position in which the crystal was placed is then connected to one of the six pins 40UL through 40LU which correspond to the frequency that the receiver is to receive on that channel. For example, if a 451 MHz frequency is desired to be heard on channel 1 of the receiver, a crystal 45.01 of the proper frequency for a reception of a 451 MHz signal is placed in a crystal socket 46.01 adjacent the wire end 32.01 and pin 36.01 associated with channel 1. The connector 39.01 on the end of wire 38.01 is then mated with pin 40LU.

If channel 2 is then to be made to operate to receive a frequency at 452 MHz, a crystal 45.02 similarly is placed adjacent the pin 36.02 and wire end 37.02. The connector 39.02 on the end of wire 38.02 is then connected to pin 36.01. Since channel 2 also should be programmed for the lower portion of the UHF band, and since channel 1 already is connected to the only pin permanently associated with the lower portion of the UHF band, it is necessary to connect the connector 39.02 to pin 36.01 to place the second channel on the same portion of the same band. This same technique can be repeated if desired by placing connector 39.03 on pin 36.02 to make channel 3 also in the same portion of the same band. This will enable, if desired, the receiver to operate with all of its channels in the same portion of the same band.

As can be observed, this technique of programming can be used to place any of the channels and any combination of channels on any band or bands that is desired, without limitation. As is illustrated in FIG. 1, channels 1 through 3 are patched so as to place them on the low portion of the UHF band, channels 4 and 5 are patched so as to place them on the upper portion of the UHF band, channel 6 is programmed to place it on the lower portion of the high band, channels 7 through 14 are patched so as to place them on the upper portion of the high band, channel 15 is patched so as to place it on the lower portion of the low band and channel 16 through 20 are patched so as to place them on the upper portion of the low band. While the bands are shown programmed in groups, it is not necessary for them to be patched in this manner. Since each of the wires is made long enough to reach to any pin, there is no restriction on the combination possibilities with this technique.

While there have been described above the principles of this invention in connection with a specific apparatus, it is to be clearly understood that this description is made only by way of example and not as a limitation to the scope of the invention.

What is claimed is:

1. In a stepping radio receiver for production of audio signals from radio frequency signals and capable of tuning to several separate channels on a plurality of bands, which radio receiver includes:
   a. a pre-IF section having an RF signal receiving means, mixer means, and an oscillator means; said pre-IF section being operable on a plurality of distinct bands;
   b. said RF signal receiving means being for providing sufficient RF signal lever for said mixer means;
   c. said mixer means being coupled to the RF signal receiving means;
   d. An audio detection means coupled to said mixer means for producing an audio signal when an RF signal is being received, said audio detection means including squelch means for preventing the production of an audio signal when an RF signal is not being received;
   e. said oscillator means being coupled to said mixers and operable at a given several frequencies, there being one frequency for each channel to which the receiver can tune;
   f. stepping means which is defeatable and which has several outputs which are coupled to said oscillator means for stepping said oscillator means through said given several frequencies;
   g. locking means which is connected to the stepping means for defeating said stepping means as long as an RF signal is being received and allowing resumption of operation of said stepping means when no signal is being received;
   h. a programmable band-selecting means connected to the pre-IF section of the receiver and to the stepping means for determining the band of operation of the receiver;
   i. said programmable band selecting means including a plurality of enabling means, each enabling means being for enabling operation on one of the bands;

The improvement which comprises:
   a programmable band selecting means having
   1. several wires and several first type of connecting elements, each wire having at its first end a first type of connecting element and being coupled at its second end to a respective one of the outputs of said stepping means;
   2. a first plurality of a second type of connecting elements which are of a design which permits them to mate with said first type of connecting elements, each element of said first plurality being a. electrically connected to the second end of a respective one of said several wires regardless of any mating with a first type of connecting element and b. coupled to a respective one of the outputs of said stepping means regardless of any mating with a first type of connecting element; and 3. a second plurality of a second type of connecting elements which are of a design which permits them to mate with said first type of connecting elements, said second plurality being distinct and separate from said first plurality, each connecting element of said second plurality coupling regardless of any mating with a first type of connecting element to a respective one of said enabling means for enabling operation on one of the bands.

2. The receiver of claim 1 in which said RF signal receiving means includes a plurality of RF amplifiers, there being one RF amplifier associated with each band.

3. The receiver of claim 1 in which said mixer means includes a plurality of transistors, there being one transistor associated with each band.

4. The receiver of claim 1 which additionally includes several diodes and in which each of said several wires is coupled at its second end through a respective one of said diodes to a respective one of the outputs of said stepping means.

5. The receiver of claim 4 in which there are:
1. at least 8 of said several wires,
2. at least 8 of said first type of connecting elements, each being associated with a respective one of said 8 of said several wires,
3. at least 7 of said second type of connecting elements in said first plurality and
4. at least 2 of said second type of connecting elements in said second plurality.

6. The receiver of claim 5 in which there are:
1. at least 20 of said several wires,
2. at least 20 of said first type of connecting elements, each being associated with a respective one of said 20 of said several wires,
3. at least 19 of said second type of connecting elements in said first plurality,
4. at least 3 of said second type of connecting elements in said second plurality.

7. The receiver of claim 6 in which there are 6 of said second type of connecting elements in said second plurality.

8. The receiver of claim 1 in which all of said wires are sufficiently long to permit each of said first type of connecting elements to be connected with any desired second type of connecting elements.

9. The receiver of claim 8 which additionally includes a bandpass filter in said RF signal receiving means which has a variable center frequency which may be set at a plurality of specific center frequencies, and said programmable band selecting means additionally including bandpass selecting means for determining the center frequency of said bandpass filter, said bandpass selecting means including:
1. said several wires and said several first type of connecting elements and
2. several of said second type of connecting elements which are of a design which permits them to mate with said first type of connecting elements, there being at least one of said second type of connecting elements corresponding with each of said plurality of specific center frequencies.

10. The receiver of claim 9 which additionally includes several diodes and in which each of said several wires is coupled at its second end through a respective one of said diodes to a respective one of the outputs of said stepping means.

11. In a stepping radio receiver for production of audio signals from radio frequency signals and capable of tuning to several separate channels, which radio includes;
a. a pre-IF section having an RF signal receiving means, a mixer, and an oscillator means;
b. said RF signal receiving means being for providing sufficient signal lever for said mixer;
c. an audio detection means coupled to said mixer for producing an audio signal when an RF signal is being received, said audio detection means including squelch means for preventing the production of an audio signal when an RF signal is not being received;
d. said oscillator means being coupled to said mixers and operable at a given several frequencies, there being one frequency for each channel to which the receiver can tune;
e. stepping means which is defeatable and which has several outputs which are coupled to said oscillator means for stepping said oscillator means through said given several frequencies and
f. locking means which is connected to the stepping means for defeating said stepping means as long as an RF signal is being received and allowing resumption of operation of said stepping means when no signal is being received.

The improvement which comprises:
g. a bandpass filter in said RF signal receiving means which has a variable center frequency which may be set at a plurality of specific center frequencies, and
h. a programmable patchboard bandpass selecting means connected to the RF signal receiving means of the receiver and to the stepping means for determining the center frequency of said bandpass filter of the RF signal receiving means, said programmable patchboard bandpass selecting means including:
1. several wires and several first type of connecting elements, each wire having at its first end a first type of connecting elements, and being coupled at its second end to a respective one of the outputs of said stepping means;
2. several of a second type of connecting elements which are of a design which permits them to mate with said first type of connecting elements, there being at least one of said second type of connecting elements corresponding with each of said plurality of specific center frequencies.

12. The receiver of claim 11 in which a plurality of said several of a second type of connecting elements are each electrically connected to the second end of a respective one of said several wires and being coupled regardless of any mating with a first type of connecting element to a respective one of the outputs of said stepping means.

13. The receiver of claim 11 which additionally includes several diodes and in which each of said several wires is coupled at its second end through a respective one of said diodes to a respective one of the outputs of said stepping means.

14. The receiver of claim 11 which includes a varactor diode in said bandpass filter.

15. In a stepping radio receiver for production of audio signals from radio frequency signals and capable of tuning to several separate channels, which radio includes;
   a. a pre-IF section having an RF signal receiving means, a mixer, and an oscillator means;
   b. said RF signal receiving means being for providing sufficient signal level for said mixer;
   c. an audio detection means coupled to said mixer for producing an audio signal when an RF signal is being received, said audio detection means including squelch means for preventing the production of an audio signal when an RF signal is not being received;
   d. said oscillator means being coupled to said mixers and operable at a given several frequencies, there being one frequency for each channel to which the receiver can tune;
   e. stepping means which is defeatable and which has several outputs which are coupled to said oscillator means for stepping said oscillator means through said given several frequencies and
   f. locking means which is connected to the stepping means for defeating said stepping means as long as an RF signal is being received and allowing resumption of operation of said stepping means when no signal is being received.

The improvement which comprises:
   g. a bandpass filter in said RF signal receiving means which has a variable center frequency which may be set at a plurality of specific center frequencies and which includes a plurality of separate inputs there being one input for each of said specific center frequencies, and
   h. a programmable bandpass selecting means connected to said plurality of inputs of said bandpass filter and to the stepping means for determining the center frequency of said bandpass filter of the RF signal receiving means, said programmable bandpass selecting means including:
     1. several first type of connecting elements, each of said first type of connecting elements coupling to an output of said stepping means, and
     2. several of a second type of connecting elements which are of a design which permits them to mate with said first type of connecting elements, there being at least one of said second type of connecting elements corresponding with each of said plurality of specific center frequencies.

16. The receiver of claim 15 which additionally includes several wires, each wire having at its first end a first type of connecting elements, and being coupled regardless of any mating with a first type of connecting element to a respective one of the outputs of said stepping means.

17. The receiver of claim 16 which additionally includes a varactor diode in said bandpass filter, a transistor having three elements, a source of supply voltage, a first resistor, a second resistor and a second diode, the first element of said transistor connecting directly to said source of supply voltage and the second element of said transistor coupling through said first resistor to said varactor diode, and the third element of said transistor coupling through said second diode and said second resistor to said varactor diode.

18. The receiver of claim 17 in which said first resistor comprises a part of a potentiometer, and said first element of said transistor is an emitter.

* * * * *